United States Patent
Miyata

(10) Patent No.: US 9,614,349 B2
(45) Date of Patent: Apr. 4, 2017

(54) METHOD FOR SWITCHING OUTPUT WAVELENGTH OF TUNABLE WAVELENGTH LASER, METHOD FOR SWITCHING WAVELENGTH OF TUNABLE WAVELENGTH LASER, AND TUNABLE WAVELENGTH LASER DEVICE

(71) Applicant: Sumitomo Electric Device Innovations, Inc., Yokohama-shi (JP)

(72) Inventor: Mitsuyoshi Miyata, Yokohama (JP)

(73) Assignee: Sumitomo Electric Device Innovations, Inc., Yokohama-shi (JP)

(*) Notice: Subject to any disclaimer, the term of this patent is extended or adjusted under 35 U.S.C. 154(b) by 0 days.

(21) Appl. No.: 14/610,890

(22) Filed: Jan. 30, 2015

(65) Prior Publication Data

US 2015/0222078 A1 Aug. 6, 2015

(30) Foreign Application Priority Data

Jan. 31, 2014 (JP) ................................ 2014-016910

(51) Int. Cl.
*H01S 5/0687* (2006.01)
*H01S 5/024* (2006.01)
(Continued)

(52) U.S. Cl.
CPC ........ *H01S 5/02415* (2013.01); *H01S 5/0265* (2013.01); *H01S 5/0687* (2013.01);
(Continued)

(58) Field of Classification Search
CPC .. H01S 5/0617; H01S 5/06837; H01S 5/0687; H01S 5/06804; H01S 5/0683
See application file for complete search history.

(56) References Cited

U.S. PATENT DOCUMENTS

2001/0033592 A1* 10/2001 Yamauchi ............. H01S 5/0687
372/50.21
2002/0097760 A1* 7/2002 May ......................... G01J 3/02
372/18
(Continued)

FOREIGN PATENT DOCUMENTS

JP 2009-026996 2/2009

*Primary Examiner* — Jessica Manno
*Assistant Examiner* — Sean Hagan
(74) *Attorney, Agent, or Firm* — Venable LLP; Michael A. Sartori; F. Brock Riggs

(57) ABSTRACT

A method for switching a wavelength of a tunable wavelength laser, which is provided with a temperature control device for an etalon and a wavelength detecting section for identifying a wavelength of the laser by a front/back ratio of the etalon, the wavelength of the laser being set in a target wavelength on the basis of a detection result of the wavelength detecting section, and the method comprises: driving the laser at a first wavelength; suppressing output of light of the laser in response to a command indicating an optical output at a second wavelength; starting control of the temperature control device towards a second etalon temperature corresponding to the second wavelength; and before the etalon reaches the second etalon temperature, detecting that the etalon reaches a temperature range corresponding to an allowable wavelength range corresponding to the second wavelength, and cancelling the suppression of light in response thereto.

9 Claims, 10 Drawing Sheets

(51) Int. Cl.
  *H01S 5/026*   (2006.01)
  *H01S 5/0625*  (2006.01)
  H01S 5/06      (2006.01)
  H01S 5/12      (2006.01)
  H01S 5/50      (2006.01)
  H01S 5/343     (2006.01)

(52) U.S. Cl.
  CPC ...... *H01S 5/06258* (2013.01); *H01S 5/02438* (2013.01); *H01S 5/0617* (2013.01); *H01S 5/1209* (2013.01); *H01S 5/1212* (2013.01); *H01S 5/34373* (2013.01); *H01S 5/50* (2013.01)

(56) References Cited

U.S. PATENT DOCUMENTS

| | | | | |
|---|---|---|---|---|
| 2002/0126367 | A1* | 9/2002 | Kuwahara | H01S 5/0687 359/288 |
| 2003/0067949 | A1* | 4/2003 | Nasu | H04B 10/506 372/32 |
| 2007/0280306 | A1* | 12/2007 | De Gabory | H01S 5/141 372/20 |
| 2009/0168817 | A1* | 7/2009 | Ishikawa | H01S 5/0687 372/20 |
| 2010/0246627 | A1* | 9/2010 | Yamauchi | H01S 5/0687 372/50.11 |
| 2010/0296532 | A1* | 11/2010 | Tanaka | H01S 5/06256 372/20 |
| 2014/0369368 | A1* | 12/2014 | Carter | H01S 5/0612 372/20 |

* cited by examiner

Fig.3

| Ch | INITIAL SETTING VALUES ||||||| FEEDBACK CONTROL TARGET VALUES ||
|---|---|---|---|---|---|---|---|---|---|
| | $I_{LD}$ [mA] | $I_{SOA}$ [mA] | $T_{LD}$ [degC] | $T_{Etalon}$ [degC] | $P_{heater1}$ [mW] | $P_{heater2}$ [mW] | $P_{heater3}$ [mW] | $I_{m1}$ [μA] | $I_{m2}/I_{m1}$ A.U. |
| 1 | 150.00 | 67.39 | 52.508 | 50.000 | 29.42 | 57.47 | 50.69 | 315.0 | 1.175 |
| 2 | 150.00 | 47.74 | 34.533 | 50.000 | 64.38 | 81.31 | 72.45 | 317.5 | 1.518 |
| 3 | 150.00 | 50.86 | 38.727 | 50.000 | 59.05 | 77.71 | 69.12 | 313.0 | 1.229 |
| ... | ... | ... | ... | ... | ... | ... | ... | ... | ... |
| n | 150.00 | 54.77 | 54.046 | 50.000 | 41.24 | 43.32 | 11.69 | 317.2 | 1.441 |

Fig.4

| TEMPERATURE CORRECTION COEFFICIENT |
|---|
| C1 [GHz/°C] |
| 0.7 |

METHOD FOR SWITCHING OUTPUT WAVELENGTH OF TUNABLE WAVELENGTH LASER, METHOD FOR SWITCHING WAVELENGTH OF TUNABLE WAVELENGTH LASER, AND TUNABLE WAVELENGTH LASER DEVICE

BACKGROUND OF THE INVENTION

Field of the Invention

The present invention relates to a method for switching an output wavelength of a tunable wavelength laser, a method for switching a wavelength of a tunable wavelength laser, and a tunable wavelength laser device.

Related Background Art

Japanese Patent Application Publication No. 2009-026996 discloses a tunable wavelength laser in which the output wavelength can be selected. In the technology disclosed in this document, control conditions for obtaining grid wavelengths in accordance with the International Telecommunication Union Telecommunication (ITU-T) Standardization Sector, are stored in a memory, and the control on the basis of these control conditions is implemented to lase at any of the grid wavelengths.

SUMMARY OF THE INVENTION

In order to improve the use efficiency of bandwidth which is used for optical communications, control for switching the output wavelength of a tunable wavelength laser is required. Optical output of the tunable wavelength laser to the external is suppressed during the wavelength switching carried out in the tunable wavelength laser. Shortening the time period from the start of the switching procedure to the restart of light output after the switching procedure in the tunable wavelength laser contributes to user convenience.

It is an object of one aspect of the present invention to provide a method for switching a wavelength of a tunable wavelength laser, thereby making the time period from the start of the switching to the restart of optical output after the switching in the tunable wavelength laser short. It is an object of another aspect of the present invention to provide a tunable wavelength laser device, which can shorten the above time period.

One aspect of the present invention relates to a method for switching an output wavelength of a tunable wavelength laser. In the method for switching an output wavelength of a tunable wavelength laser, the tunable wavelength laser is provided with a temperature control device and a wavelength detecting section including an etalon, the temperature control device controls a temperature of the etalon, the wavelength detecting section identifies the output of the tunable wavelength laser by a ratio of intensity of light input to the etalon against intensity of light output from the etalon, and the output wavelength of the tunable wavelength laser is controlled to a target wavelength based on a detection result of the wavelength detecting section, and the method comprises: a first step of driving the tunable wavelength laser at a first wavelength; a second step of, after the first step, suppressing intensity of light output from the tunable wavelength laser in response to a command indicating preset intensity of light output from the tunable wavelength laser at a second wavelength different from the first wavelength; a third step of, after the second step, starting control of the temperature control device such that the temperature of the etalon becomes close to a second etalon temperature corresponding to the second wavelength, the second etalon temperature being different from a first etalon temperature corresponding to the first wavelength; and a fourth step of, before the temperature of the etalon reaches the second etalon temperature, detecting whether the temperature of the etalon enters within a temperature range corresponding to an allowable wavelength range around the second wavelength of the tunable wavelength laser, and cancelling the suppression of the intensity of the light output from the tunable wavelength laser in response to the detection.

A further aspect of the present invention relates to a tunable wavelength, laser device. The tunable wavelength laser device comprises: a tunable wavelength laser; a wavelength detecting section configured to identify an output wavelength of the tunable wavelength laser by a ratio of intensity of light input to an etalon and intensity of light output from the etalon; a temperature control device configured to control a temperature of the etalon; and a controller configured to set the output wavelength of the tunable wavelength laser to a target wavelength, the controller being configured to: drive the tunable wavelength laser at a first wavelength; suppress intensity of light output from the tunable wavelength laser in response to a command indicating that the tunable wavelength laser emits light at a second wavelength different from the first wavelength; start control of the temperature control device such that the temperature of the etalon becomes close to a second etalon temperature corresponding to the second wavelength, the second etalon temperature being different from a first etalon temperature corresponding to the first wavelength; acquire a detection result indicating that the temperature of the etalon has entered a temperature range corresponding to an allowable wavelength range around the second wavelength of the tunable wavelength laser, before the temperature of the etalon reaches the second etalon temperature; and cancel the suppression of the intensity of the light output from the tunable wavelength laser.

A still further aspect of the present invention relates to a method for switching a wavelength of a tunable wavelength laser. In the method for switching a wavelength of a tunable wavelength laser, which is provided with a temperature control device and a wavelength detecting section, the temperature control device controls a temperature of an etalon, the wavelength detecting section identifies an output wavelength of the tunable wavelength laser by a ratio of intensity of light input to the etalon against intensity of light output from the etalon, the wavelength of the tunable wavelength laser is set in a target wavelength on the basis of a detection result of the wavelength detecting section, and the method comprises: a first step of driving the tunable wavelength laser at a first wavelength; a second step of, after the first step, suppressing intensity of light output from the tunable wavelength laser in response to a command indicating that the tunable wavelength laser emits light at a second wavelength different from the first wavelength; a third step of acquiring drive conditions enabling the tunable wavelength laser to lase at the second wavelength; a fourth step of calculating drive conditions for driving the tunable wavelength laser at a third wavelength by referring to the drive conditions for the second wavelength, and a wavelength difference between the second wavelength and the third wavelength, the third wavelength being different from the second wavelength and the first wavelength; a fifth step of, after the fourth step, starting control of the temperature control device such that the temperature of the etalon becomes close to a second etalon temperature corresponding to the second wavelength, the second etalon temperature being different from a first etalon temperature corresponding to the first wavelength; and a sixth step of detecting whether the temperature of the etalon reaches a temperature range corresponding to an allowable wavelength range around the second wavelength of the tunable wavelength laser, and cancelling the suppression of the intensity of the light output from the tunable wavelength laser in response to the detection.

BRIEF DESCRIPTION OF THE DRAWINGS

The abovementioned objects and other objects, features and advantages of the present invention will become apparent from the following detailed description of preferred embodiments of the present invention with reference to the accompanying drawings.

FIG. 3 is a view showing the table indicating the initial set values and feedback control target values;

FIG. 4 is a diagram showing a table representing a temperature correction coefficient;

DESCRIPTION OF THE PREFERRED EMBODIMENTS

Figure 1:
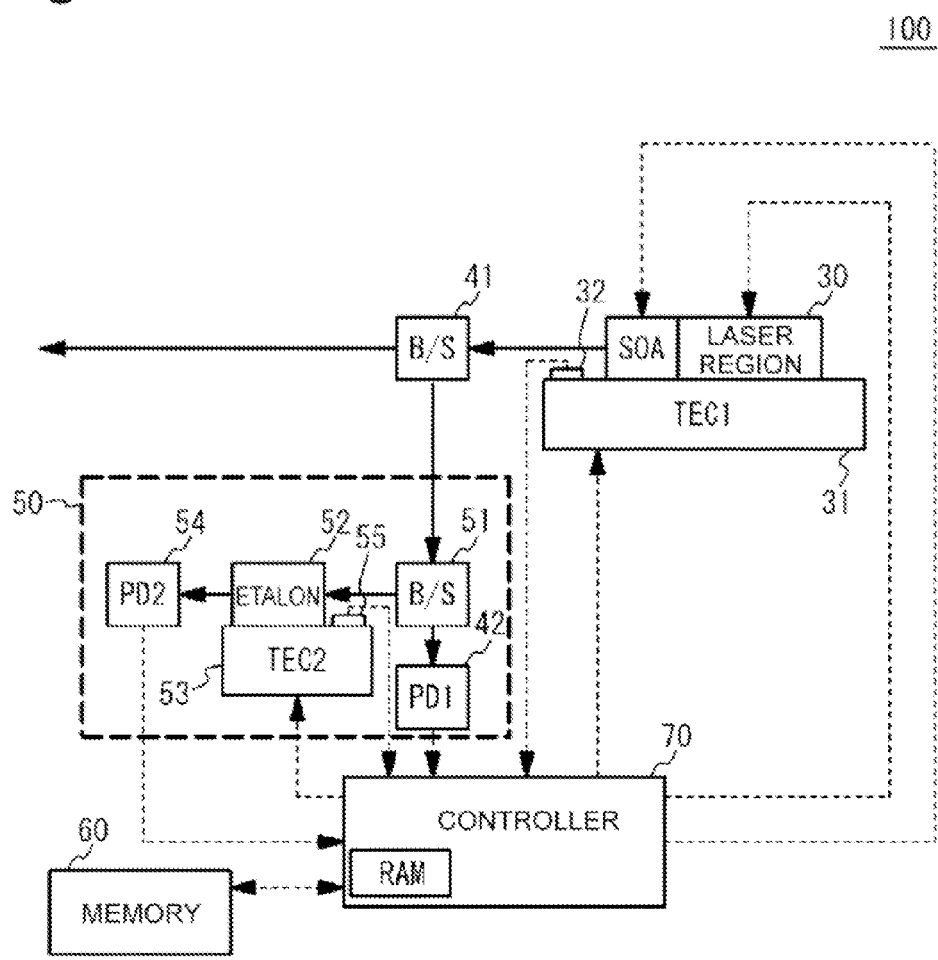
FIG. 1 is a block diagram showing the general configuration of the tunable wavelength laser device according to an embodiment of the present invention.

Several practical examples are described below.

An embodiment according to the one aspect relates to a method for switching an output wavelength of a tunable wavelength laser. In the method, the tunable wavelength laser is provided with a temperature control device and a wavelength detecting section including an etalon; the temperature control device controls a temperature of the etalon; the wavelength detecting section identifies the output of the tunable wavelength laser by a ratio of intensity of light input to the etalon against intensity of light output from the etalon; and the output wavelength of the tunable wavelength laser is controlled to a target wavelength based on a detection result of the wavelength detecting section. The method comprises: a first step of driving the tunable wavelength laser at a first wavelength; a second step of, after the first step, suppressing intensity of light output from the tunable wavelength laser in response to a command indicating preset intensity of light output from the tunable wavelength laser at a second wavelength different from the first wavelength; a third step of, after the second step, starting control of the temperature control device such that the temperature of the etalon becomes close to a second etalon temperature corresponding to the second wavelength, the second etalon temperature being different from a first etalon temperature corresponding to the first wavelength; and a fourth step of before the temperature of the etalon reaches the second etalon temperature, detecting whether the temperature of the etalon enters within a temperature range corresponding to an allowable wavelength range around the second wavelength of the tunable wavelength laser, and cancelling the suppression of the intensity of the light output from the tunable wavelength laser in response to the detection. The method according to the above embodiment further comprises a fifth step of detecting whether the temperature of the etalon reaches the second etalon temperature. In the method according to the above embodiment, the fifth step comprises a step of detecting whether the temperature of the etalon enters within another range around the second etalon temperature, the another range being narrower than the temperature range, and the detection is regarded as that the temperature of the etalon has reached the second etalon temperature when the temperature of the etalon enters within the another range. In the method according to the above embodiment, the fourth step comprises a step of, before cancelling the suppression of the intensity of the light output from the tunable wavelength laser, confirming that the temperature of the etalon stays within the temperature range for a prescribed period.

Another embodiment according to the above aspect relates to a tunable wavelength laser device, which comprises: a tunable wavelength laser; a wavelength detecting section configured to identify an output wavelength of the tunable wavelength laser by a ratio of intensity of light input to an etalon and intensity of light output from the etalon; a temperature control device configured to control a temperature of the etalon; and a controller configured to set the output wavelength of the tunable wavelength laser to a target wavelength, the controller being configured to: drive the tunable wavelength laser at a first wavelength; suppress intensity of light output from the tunable wavelength laser in response to a command indicating that the tunable wavelength laser emits light at a second wavelength different from the first wavelength; start control of the temperature control device such that the temperature of the etalon becomes close to a second etalon temperature corresponding to the second wavelength, the second etalon temperature being different from a first etalon temperature corresponding to the first wavelength; acquire a detection result indicating that the temperature of the etalon has entered a temperature range corresponding to an allowable wavelength range around the second wavelength of the tunable wavelength laser, before the temperature of the etalon reaches the second etalon temperature; and cancel the suppression of the intensity of the light output from the tunable wavelength laser. The tunable wavelength laser device according to the above embodiment further comprises a temperature detecting section provided on the temperature control device, and the temperature detecting section detects the temperature of the etalon. In the tunable wavelength laser device according to the above embodiment, the tunable wavelength laser comprises an optical semiconductor amplifier preventing the tunable wavelength laser from emitting light. The tunable wavelength laser device according to the above embodiment further comprises another temperature control device controlling a temperature of the tunable wavelength laser, in the tunable wavelength laser device according to the above embodiment, the controller acquires the detection result indicating that the temperature of the etalon has reached a second etalon temperature. In the tunable wavelength laser device according to the above embodiment, the controller acquires the detection result indicating that the temperature of the etalon enters another range around the second etalon temperature, and the another range is narrower than the temperature range, and the temperature of the etalon is regarded to reach the second etalon temperature when the temperature of the etalon enters the range. In the tunable wavelength laser device according to the above embodiment, the controller cancels the suppression of the intensity of the light output from the tunable wavelength laser after the temperature of the etalon is confirmed to stay within the temperature range for a prescribed period. The tunable wavelength laser device according to the above embodiment further comprises a temperature detecting section provided on the temperature control device, the temperature detecting section detecting the temperature of the etalon. In the tunable wavelength laser device according to the above embodiment, the tunable wavelength laser includes an optical semiconductor amplifier preventing the tunable wavelength laser from emitting light. The tunable wavelength laser device according to the above embodiment further comprises another temperature control device for controlling a temperature of the tunable wavelength laser.

An embodiment according to still another aspect relates to a method for switching a wavelength of a tunable wavelength laser, which is provided with a temperature control device and a wavelength detecting section. The temperature control device controls a temperature of an etalon; the wavelength detecting section identifies an output wavelength of the tunable wavelength laser by a ratio of intensity of light input to the etalon against intensity of light output from the etalon; and the wavelength of the tunable wavelength laser is set in a target wavelength on the basis of a detection result of the wavelength detecting section. The method comprises: a first step of driving the tunable wavelength laser at a first wavelength; a second step of, after the first step, suppressing intensity of light output from the tunable wavelength laser in response to a command indicating that the tunable wavelength laser emits light at a second wavelength different from the first wavelength; a third step of acquiring drive conditions enabling the tunable wavelength laser to lase at the second wavelength; a fourth step of calculating drive conditions for driving the tunable wavelength laser at a third wavelength by referring to the drive conditions for the second wavelength, and a wavelength difference between the second wavelength and the third wavelength, the third wavelength being different from the second wavelength and the first wavelength; a fifth step of, after the fourth step, starting control of the temperature control device such that the temperature of the etalon becomes close to a second etalon temperature corresponding to the second wavelength, the second etalon temperature being different from a first etalon temperature corresponding to the first wavelength; and a sixth step of detecting whether the temperature of the etalon reaches a temperature range corresponding to an allowable wavelength range around the second wavelength of the tunable wavelength laser, and cancelling the suppression of the intensity of the light output from the tunable wavelength laser in response to the detection.

Embodiments of a method for controlling a tunable wavelength laser and a tunable wavelength laser device according to the present invention are described below with reference to the drawings. The present invention is not limited to these embodiments.

FIG. 1 is a block diagram showing the general configuration of the tunable wavelength laser device 100 according to the first embodiment. As shown in FIG. 1, the tunable wavelength laser device 100 comprises a semiconductor laser 30 (tunable semiconductor laser) functioning as a laser, and the wavelength of the semiconductor laser 30 is controllable. The semiconductor laser. 30 according to the present embodiment includes a region adjacent to a laser region, and this region comprises a semiconductor optical amplifier (referred to as SOA). This SOA functions as an optical output control section. The SOA can increase or decrease the intensity of the laser beam for optical output, as required. Furthermore, the SOA can also control the intensity of the optical output to substantially zero. Moreover, the tunable wavelength laser device 100 also comprises a detection section 50, a memory 60, and a controller 70, and the like. The detecting section 50 functions as an output detection section and a wavelength locking section. The controller 70 controls a semiconductor laser in the tunable wavelength laser device 100, and contains a random access memory (RAM) therein. Each section of the tunable wavelength laser 100 is arranged in a chassis 80.

Figure 2:
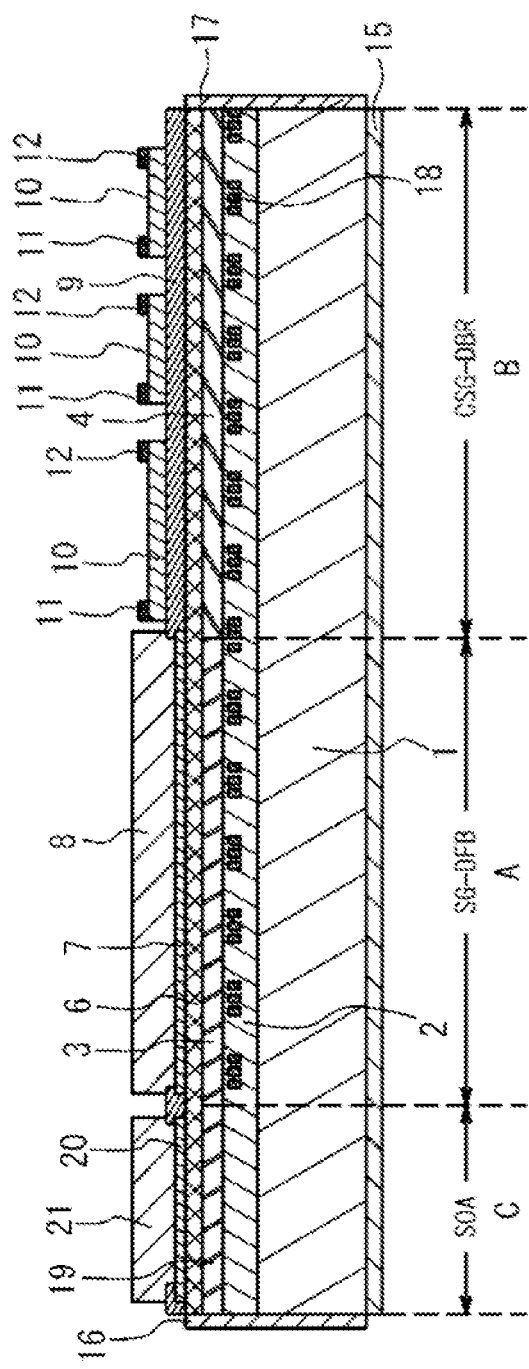
FIG. 2 is a schematic cross-sectional view showing the general configuration of a semiconductor laser.

FIG. 2 is a schematic cross-sectional view showing the general configuration of a semiconductor laser 30 according to the present embodiment. As shown in FIG. 2, the semiconductor laser 30 comprises: a sampled grating distributed feedback (referred to as "SG-DFB") region A; a chirped sampled grating distributed Bragg reflector (referred to as "CSG-DB") region B; and a semiconductor optical amplifier (referred to as "SOA") region C. Accordingly, the semiconductor laser 30 comprises a wavelength selecting mirror in the semiconductor structure thereof.

In one example for the present embodiment, the SOA region C, SG-DFB region A, and CSG-DBR region B are arranged in this order in the direction from the front of the semiconductor laser 30 to the rear. The SG-DFB region A has an optical gain and is provided with a sampled grating. The CSG-DBR region B has no optical gain and is provided with a sampled grating. The SG-DFB region A and the CSG-DBR region B correspond to the laser region shown in FIG. 1, and the SOA region C corresponds to the SOA region shown in FIG. 2.

The SG-DFB region A has a structure in which a lower cladding layer 2, an active layer 3, an upper cladding layer 6, and a contact layer 7 are stacked on the substrate 1 to form the semiconductor stack, and an electrode 8 is provided on the semiconductor stack. The CSG-DBR region B has a structure in which a lower cladding layer 2, an optical waveguide layer 4, an upper cladding layer 6, and an insulating film 9 are stacked on the substrate 1 to form a stack, and plural heaters 10 are arranged on the stack. The heaters 10 are each provided with a power source electrode 11 and a ground electrode 12. The SOA region C has a structure in which a lower cladding layer 2, an optical amplification layer 19, an upper cladding layer 6, and a contact layer 20 are stacked on the substrate 1 to form a stack, and an electrode 21 is located on the stack.

The substrate 1, the lower cladding layer 2 and the upper cladding layer 6 are integrally formed to extend over the SG-DFB region A, the CSG-DBR region B and the SOA region C. The active layer 3, the optical waveguide layer 4 and the optical amplification layer 19 are formed to extend along a single plane. The boundary between the SG-DFB region A and the CSG-DBR region B is located at the boundary between the active layer 3 and the optical waveguide layer 4.

An end face film 16 is formed on the end face of one end part, which contains the SOA region C, of the tunable wavelength laser 100, and the end face of the one end part comprises the end face of the substrate 1, the end face of the lower cladding layer 2, the end face of the optical amplification layer 19 and the end face of the upper cladding layer 6. In the present embodiment, the end face film 16 is provided for an anti-reflection (AR) film. The end face film 16 constitutes a front end face of the semiconductor laser 30. An end face film 17 is formed on the end face of the other end part, containing the CSG-DBR region B, of the tunable wavelength laser device 100, and the end face of the other end part comprises the other end face of the substrate 1, the other end face of the lower cladding layer 2, the other end face of the optical waveguide layer 4 and the other end face of the upper cladding layer 6. In the present embodiment, the end face film 17 is provided for an AR film. The end face film 17 constitutes a rear end face of the semiconductor laser 30.

The substrate 1 is made of a crystalline substrate, the material of which is, for example, n-type InP. The lower cladding layer 2 has n-type conductivity whereas the upper cladding layer 6 has p-type conductivity, and the lower cladding layer 2 and the upper cladding layer both are made of, for example, InP. The lower cladding layer 2 and the upper cladding layer 6, which sandwiches the active layer 3, the optical waveguide layer 4 and the optical amplification layer 19 therebetween, confine light to the internal region including the active layer 3, the optical waveguide layer 4 and the optical amplification layer 19.

The active layer 3 is constituted by a semiconductor that can provide an optical gain. The active layer 3 has, for example, a quantum well structure; specifically a structure in which well layers each made of $Ga_{0.32}In_{0.68}As_{0.92}P_{0.08}$ (with thickness of 5 nm) and barrier layers made of $Ga_{0.22}In_{0.78}As_{0.47}P_{0.53}$ (with thickness of 10 nm) are stacked alternately. The optical waveguide layer 4 can be configured as, for example, a bulk semiconductor layer and can be made of, specifically, $Ga_{0.22}In_{0.78}As_{0.47}P_{0.53}$. In the present embodiment, the optical waveguide layer 4 has a larger energy gap than the active layer 3.

The optical amplification layer 19 has an optical gain in response to the injection of current from the electrode 21 to amplify light therein. The optical amplification layer 19 has, for example, a quantum well structure and, specifically, may have a structure in which well layers made of $Ga_{0.35}In_{0.35}As_{0.99}P_{0.01}$ (with thickness of 5 nm) and barrier layers made of $Ga_{0.15}In_{0.85}As_{0.32}P_{0.68}$ (with thickness of 10 nm) are stacked alternately. Furthermore, another example is as follows: a bulk semiconductor made of; for example, $Ga_{0.44}In_{0.56}As_{0.95}P_{0.05}$, can be applied to the optical amplification layer 19. The optical amplification layer 19 may be made of the same material as the active layer 3.

The contact layers 7, 20 can be made of, for example, p-type $Ga_{0.47}In_{0.53}As$ crystal. The insulating film 9 acts as a protective film made of silicon nitride film (SiN) or silicon oxide film (SiO). Each heater 10 is provided with a thin film resistor made of titanium tungsten (TiW). The heaters 10 may be formed so as to extend beyond the boundary between adjacent segments in the CSG-DBR region B.

The electrodes 8, 21, the power source electrode 11 and the ground electrode 12 are made of a conductive material, such as gold (Au). A backside electrode 15 is formed on the rear side of the substrate 1. The backside electrode 15 is formed so as to extend over the SG-DFB region A, the CSG-DBR region 13 and the SOA region C.

The end face film 16 and the end face film 17 act as AR films having a reflectivity of not more than 1.0%, and have properties to make the end faces substantially non-reflective. The AR film can be made of dielectric stack layers of, for example, $MgF_2$ and TiON. In the present embodiment, the AR film is formed to constitute each of both ends of the laser, and alternatively the end face film 17 may be made of a reflective film with a significant reflectivity. The semiconductor region that is in contact with the end face film 17, as shown in FIG. 2, with a significant reflectivity may be provided with a structure including a light absorbing layer, so that this structure can suppress light from leaking through the end face film 17 outward. A significant reflectivity can be, for example, a reflectivity of not less than 10%. Here, "reflectivity" is defined as reflection in the inside of the semiconductor laser.

The diffraction gratings (corrugation) 18 are formed in plural locations respectively and arranged apart from each other at a prescribed interval in the lower cladding layer 2 extending in the SG-DFB region A and the CSG-DBR region B. This arrangement forms a sampled grating in the SG-DFB region A and the CSG-DBR region B. In the SG-DFB region A and the CSG-DBR region B, plural segments are provided in the lower cladding layer 2. Here, a "segment" is defined as a region containing a single diffraction grating section and a single spacing section which are in contact with each other, where the diffraction grating section contains a single diffraction grating 18 and the spacing section contains no diffraction grating 18. In other words, the segment is defined as a region in which a spacing section, which is sandwiched by two diffraction grating sections located at both ends of the spacing section, respectively, and one of these diffraction grating sections are joined. The diffraction grating 18 is made of a material having a refractive index different from the lower cladding layer 2. If the lower cladding layer 2 may be made of InP, the diffraction grating can be made of a material, for example, $Ga_{0.22}In_{0.78}As_{0.47}P_{0.53}$.

The diffraction grating 18 can be formed by patterning using two-beam interference exposure. Spacing sections to be positioned between diffraction gratings 18 can be formed by the following: carrying out the first exposure to transfer a pattern for the diffraction gratings 18 to a resist, thereby forming the patterned resist; and then carrying out the second exposure to the areas in which the spacing section are to be formed. The diffraction gratings 18 in the SG-DFB region A and the diffraction gratings 18 in the CSG-DBR region B may have the same pitch, or the pitch of the diffraction gratings 18 in the SG-DFB region A may be different from that of the diffraction gratings 18 in the CSG-DBR region B. In the present embodiment, for example; these pitches of the diffraction gratings 18 in the both regions A and B are set to be the same. Furthermore, in the segments, the diffraction gratings 18 in the SG-DFB region A and the CSG-DBR region B may have the same length or may have different lengths. Furthermore, the diffraction gratings 18 in the SG-DFB region A may have the same length, the diffraction gratings 18 in the CSG-DBR region B may have the same length, and the diffraction gratings 18 in the SG-DFB region A and the CSG-DBR region B may have different lengths.

The optical lengths of the segments in the SG-DFB region A are substantially the same as each other. The optical lengths of at least two segments among the segments in the CSG-DBR region B are formed so as to be different from each other. Accordingly, the intensities of the peaks in the wavelength characteristics in the CSG-DBR region B have a wavelength dependency. The average optical length of the segments in the SG-DFB region A and the average optical length of the segments in the CSG-DBR region B are different from each other. As described above, the arrangement of the segments in the SG-DFB region A and the arrangement of the segments in the CSG-DBR region B constitute an optical cavity for the semiconductor laser 30.

In each of the SG-DFB region A and the CSG-DBR region B, light components reflected thereby interferes with each other. The active layer 3 is provided in the SG-DFB region A, and the injection of carriers thereinto generates a discrete gain spectrum with plural peaks arrayed in a prescribed wavelength interval, and the intensities of the peaks are substantially uniform. Furthermore, a discrete reflection spectrum with plural peaks arrayed in a prescribed wavelength interval is in the CSG-DBR region B, and the plural peaks of the discrete reflection spectrum has plural peaks have different peak intensities. The arrangement of the peak wavelengths in the wavelength characteristics of the SG-DFB region A is different from that of the CSG-DBR region B. The combination of these wavelength characteristics provides the Vernier effect to allow the selection of the wavelength that satisfies the lasing conditions.

As shown in FIG. 1, the semiconductor laser 30 is disposed on a first temperature control device 31. The first temperature control device 31 includes a Peltier device and functions as a thermoelectric cooler (TEC). The first thermistor 32 is also disposed on the first temperature control device 31. The first thermistor 32 detects the temperature of the first temperature control device 31. The temperature of the semiconductor laser 30 can be determined on the basis of the temperature detected by the first thermistor 32.

In the tunable wavelength laser 100, the detecting section 50 is located in front of the semiconductor laser 30. Since the detecting section 50 functions as a wavelength locker, the tunable wavelength laser device 100 can be called a front locker type. The detection section 50 is provided with a first light receiving device 42, a beam splitter 51, an etalon 52, a second temperature control device 53, a second light receiving device 54, and a second thermistor 55.

The beam splitter 41 is disposed at a position at which the beam splitter 41 branches off an output beam coming from the front end of the semiconductor laser 30. The beam splitter 51 is disposed at a position at which the beam splitter 51 branches off an optical beam coming from the beam splitter 41. The first light receiving device 42 is disposed at a position at which the first light receiving device 42 can receive one of the two optical beams branched off by the beam splitter 51. The etalon 52 is disposed at a position at which the etalon 52 can receive the other of the two optical beams branched off by the beam splitter 51. The second light receiving device 54 is disposed at a position at which the second light receiving device 54 can receive an optical beam that has transmitted through the etalon 52.

The etalon 52 has transmission characteristics in which the transmittance changes periodically with increases or decreases in the wavelength of the light incident thereon. In the present embodiment, a solid etalon is used as the etalon 52. The periodic wavelength characteristics of the solid etalon change with change in the temperature thereof. The etalon 52 is disposed at a position at which the etalon 52 can receive the other of the two optical beams branched off by the beam splitter 51. Furthermore, the etalon 52 is disposed on the second temperature control device 53. The second temperature control device 53 includes a Peltier device and functions as a thermoelectric cooler (TEC).

The second light receiving device 54 is disposed at a position at which the second light receiving device 54 can receive an optical beam that has transmitted through the etalon 52. The second thermistor 55 is provided in order to determine the temperature of the etalon 52. The second thermistor 55 is disposed on, for example, the second temperature control device 53. In the present embodiment, the temperature of the second temperature control device 53 is detected by the second thermistor 55 to determine the temperature of the etalon 52.

The memory 60 function as a rewriteable storage device. A typical example of the rewriteable storage device can be a flash memory. The controller 70 comprises a central processing unit (CPU), a random access memory (RAM), a power source, and the like. The RAM, which functions as a memory, can temporarily stores programs to be executed by the central processing unit, data to be processed by the central processing unit, and the like.

The memory 60 stores an initial setting value for each section of the tunable wavelength laser device 100, and feedback control target values, which are contained in association with the respective channels. The channels indicate identification numbers corresponding to the respective lasing wavelengths that the semiconductor laser 30 can provide. The wavelengths of the channels are determined to be arranged discretely in the variable-wavelength range of the tunable wavelength laser device 100. For example, each channel corresponds to a grid wavelength (the interval of 50 GHz) in accordance with the International Telecommunication Union Telecommunication (ITU-T) Standardization Sector. Alternatively, initial setting values may be prepared which are arranged at narrower interval than a grid interval of the ITU-T. In the present embodiment, the wavelengths for the respective channels are defined as the fundamental wavelengths.

FIG. 3 is a table indicating the abovementioned initial setting values and feedback control target values. As shown in FIG. 3, the initial setting values include: an initial current value $I_{LD}$ the current of which is supplied to the electrode 8 in the SG-DFB region A, an initial current value $I_{SOA}$ the current of which is supplied to the electrode 21 in the SOA region C, an initial temperature value $T_{LD}$ of the semiconductor laser 30, an initial temperature value $T_{Etalon}$ of the etalon 52, and initial power values $P_{Heater1}$ to $P_{Heater3}$ which are supplied to the respective heaters 10. These initial setting values are determined for each channel. Each feedback control target value is used as a target value in the feedback control that the controller 70 implements. The feedback control target value includes a target value $I_{m1}$ for the photocurrent provided by the first light receiving device 42, and a target value $I_{m2}/I_{m1}$ of the ratio between the photocurrent $I_{m1}$ provided by the first light receiving device 42 and the photocurrent $I_{m2}$ provided by the second light receiving device 54. The control target value is also set for each channel. These values are tuned by use of a wavelength meter for each individual tunable wavelength laser device 100 before shipment. Furthermore, as shown in FIG. 4, a temperature correction coefficient C1 is stored in the memory 60. The details of the temperature correction coefficient C1 will be described below. In the present embodiment, the temperature correction coefficient C1 is shared with the all channel.

Figure 5:
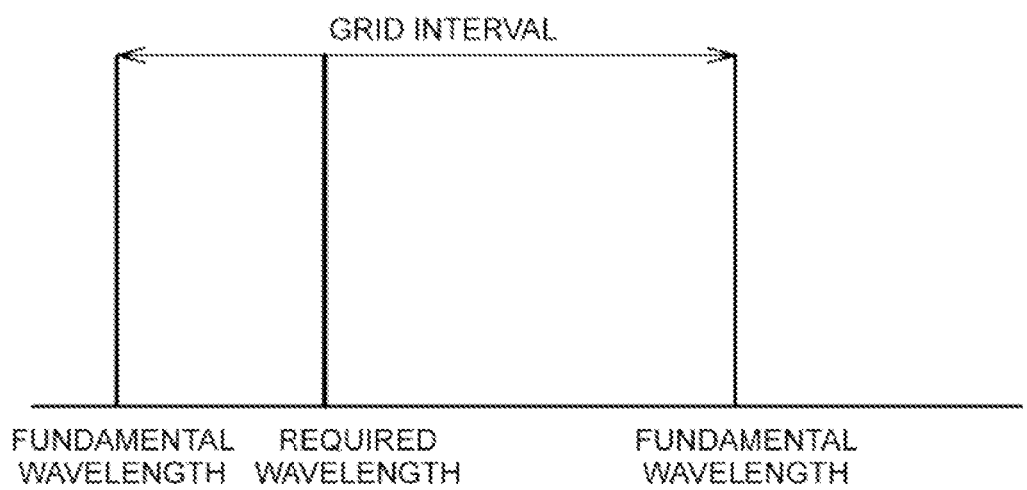
FIG. 5 is a diagram illustrating the relationship between a required wavelength and a fundamental wavelength in grid-less control.

The tunable wavelength laser device 100 according to the present embodiment can provide a laser beam of a required wavelength that is different from the fundamental wavelengths. Control which enables the tunable wavelength laser device 100 to provide a wavelength different from the fundamental wavelengths is hereinafter called "grid-less control." FIG. 5 is a diagram illustrating the relationship between the required wavelength and the fundamental wavelengths in grid-less control. As shown in FIG. 5, in grid-less control, the required wavelength can be located between one fundamental wavelength and another fundamental wavelength adjacent thereto, and the required wavelength may coincide with the fundamental wavelength.

Figure 6:
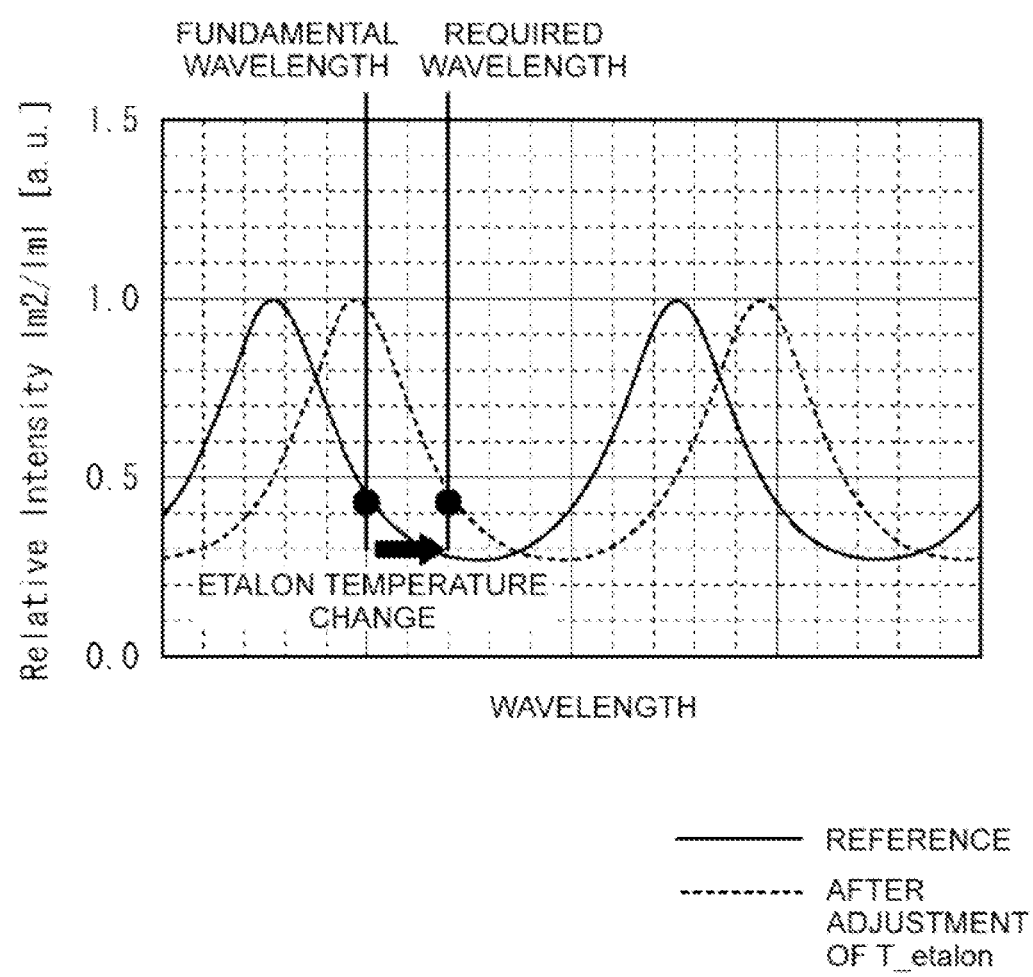
FIG. 6 is a diagram showing the principle of grid-less control.

FIG. 6 is a diagram showing the principle in grid-less control. In FIG. 6, the horizontal axis represents the wavelength, and the vertical axis represents the normalized value of a ratio $I_{m2}/I_{m1}$ (the transmittance of the etalon 52). In FIG. 6, the solid line indicates the wavelength characteristics corresponding to an initial temperature value $T_{Etalon}$ of the etalon 52, and the broken line indicates the wavelength characteristics exhibited by the etalon 52 whose temperature has been risen by the second temperature control device 53. Here, in the control in which the ratio $I_{m2}/I_{m1}$ at the black circles on the solid line is used as the feedback control target value, the etalon 52 is at the initial temperature value $T_{Etalon}$, so that the device lases at one of the fundamental wavelengths. On the other hand, when the etalon 52 is set at a temperature corresponding to the wavelength characteristics indicated by the broken line, the ratio $I_{m2}/I_{m1}$ remains unchanged to be a value for obtaining the fundamental wavelength (the black circles on the broken line), but the actual lasing wavelength is shifted from the fundamental wavelength by the amount of change in the etalon characteristics. In other words, the etalon characteristics are shifted by an amount corresponding to the wavelength difference between the required wavelength and the fundamental wavelength, so that the required wavelength can be achieved by using ratio $I_{m2}/I_{m1}$, left unchanged, as a target value for feedback control. Specifically, the calculation for changing the etalon temperature is carried out on the basis of the wavelength difference ΔF between the required wavelength and the fundamental wavelength, and using this calculated value as the etalon temperature can achieve the required wavelength.

As described above, the wavelength characteristics of the etalon 52 are shifted in response to the temperature thereof. The ratio, i.e., amount of frequency change/amount of temperature change (in GHz/° C.) in the etalon 52 is referred to as the temperature correction coefficient C1 of the etalon 52, where the wavelength is expressed in frequency. The temperature correction coefficient C1 corresponds to the rate of change in the drive conditions of the tunable wavelength laser with respect to change in the wavelength.

The setting temperature of the etalon 52 for achieving control to the required wavelength is represented as "Tetln_A" (in ° C.). Furthermore, the initial temperature of the etalon 52, in other words, the temperature of the etalon 52 corresponding to the selected fundamental wavelength is represented as "Tetln_B" (in ° C.). The Teltn_B corresponds to $T_{Etalon}$, which is acquired from the memory 60. Moreover, the wavelength difference between the fundamental wavelength and the required wavelength (absolute value) is referred to as ΔF (in GHz). In this case, the relationship between these parameters can be expressed as Formula (1) shown below. The setting temperature Tetln_A required in order to obtain the required wavelength can be determined by use of Formula (1):

$$Tet\ln\_A = Tet\ln\_B + \Delta F/C1 \qquad (1).$$

By controlling the temperature of the second temperature control device 53 to the setting temperature Tetln_A, the required wavelength can be obtained by using the ratio $I_{m2}/I_{m1}$, left unchanged. Executing the operations described above, as shown in FIG. 6, enables the semiconductor laser 30 to lase at a wavelength (required wavelength) which is shifted from the fundamental wavelength by an amount corresponding to the shift in the characteristics of the etalon 52.

Next, an operation for switching the wavelength of the tunable wavelength laser device 100 will be described. A command to carry out the switching of wavelength is input to the controller 70, and then the controller 70 carries out the control for suppressing the external output of light. In the example in FIG. 1, the optical output is suppressed by applying a reverse bias to the SOA and causing the SOA to function as a light absorber. After blocking off the output of light to the exterior, then the controller 70 carries out a calculation of the drive conditions corresponding to the lasing wavelength of light that is to be output. The same procedure as that described above can be used for this calculation.

When the new drive conditions have been obtained, the controller 70 starts the control of the respective sections of the tunable wavelength laser device 100. In this case, the control of temperature of the second temperature control device 53 requires the longest operation time period among the control. If grid-less control is not carried out therein, the temperature of the second temperature control device 53 is set for the grid wavelengths at a single temperature, which enables the free spectrum range (FSR) of the etalon to be arranged at the interval of the grid wavelengths. However, if grid-less control is carried out therein, change in the temperature of the second temperature control device 53 is needed. The temperature control has to change the temperature of a component(s) with a certain amount of heat capacity, and therefore the time period required to carry out the control becomes longer, compared to the control of the current and/or voltage of the semiconductor laser 30. Consequently, in the grid-less control, the time period required to carry out the switching of the wavelength also becomes longer than the grid-less control.

Figure 7:
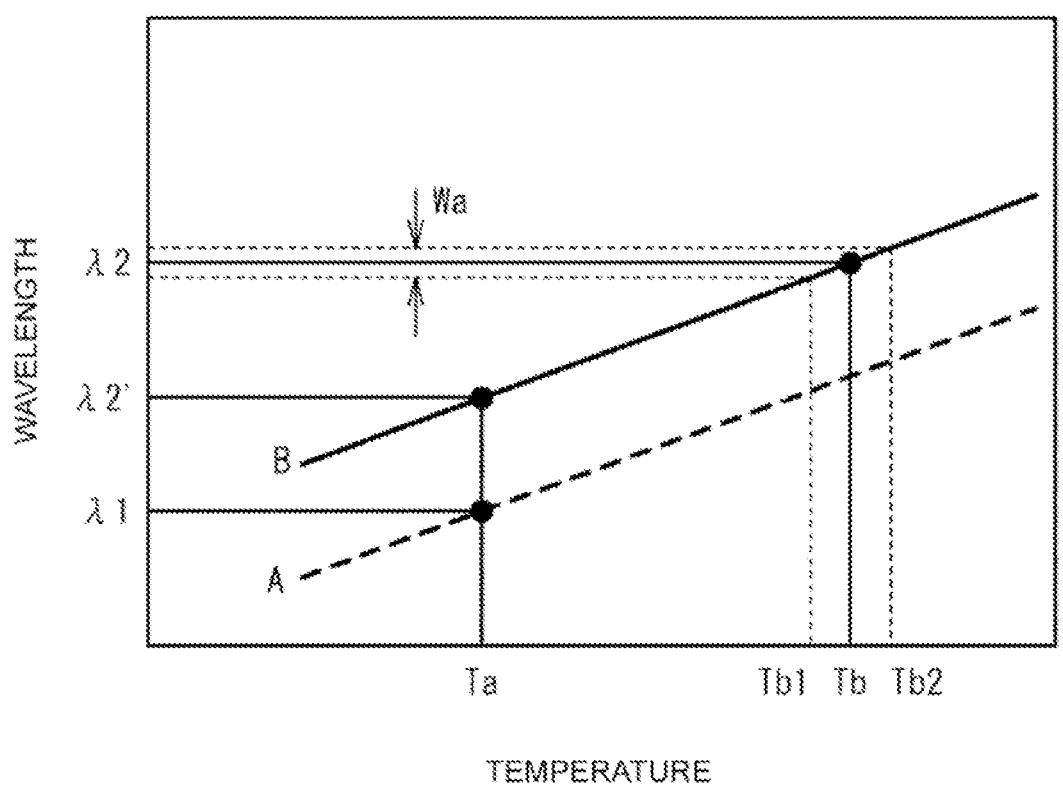
FIG. 7 is a diagram showing a relationship between the temperature and lasing wavelength of a second temperature control device.

FIG. 7 is a diagram showing a relationship between the temperature and the lasing wavelength of the second temperature control device 53. FIG. 7 shows the lasing wavelength obtained by the control in which the temperature of the second temperature control device 53 is changed under drive conditions corresponding to a lasing wavelength to be output next. In FIG. 7, Ta is defined as the temperature that is set in the second temperature control device 53 in order to achieve the wavelength λ1 which is used prior to carrying out the switching of wavelength, whereas Tb is defined as the temperature which is required for the second temperature control device 53 in order to achieve a new lasing wavelength λ2 to be used after the switching of wavelength.

The characteristics A indicated by the dash line in FIG. 7 correspond to the drive conditions for lasing at the wavelength λ1, and the characteristics B indicated by the solid line correspond to the drive conditions for lasing at the wavelength λ2. In response to a wavelength switching command for causing the change in the current and/or voltage of the semiconductor laser 30, the characteristics of the semiconductor laser 30 change from the characteristics A to the characteristics B. After this change, the internal state of the cavity of the semiconductor laser 30 is determined to be in a state corresponding to the wavelength indicated by wavelength λ2'.

Next, the internal state of the lasing of the semiconductor laser 30 changes in accordance with the characteristics B, with the changing temperature from Ta to Tb in the second temperature control device 53. Wa in FIG. 7 indicates the range of wavelength which is permitted when the user requires a lasing wavelength of λ2. As shown in FIG. 7, it can be seen that a temperature of the second temperature control device 53 in the range of Tb1 to Tb2 can provide a lasing wavelength in the range of Wa. In other words, if the temperature of the second temperature control device 53 reaches Tb1 during the change in temperature from the temperature Ta before the wavelength switching to the temperature Tb after the wavelength switching, then the suppression of light output in the tunable wavelength laser device 100 is cancelled.

For instance, when the time period required for the temperature to change from Tb1 to Tb is one second, the output increase (shutter ON) in the SOA is carried out at the time when the temperature reaches Tb1, so that the SOA can provide optical output in preceding one second prior to reaching the temperature Tb. This results in that the wavelength control can be started one second earlier by the detecting section 50 and the controller 70 to shorten the time period of the wavelength switching. The time period that the user can permit for wavelength switching is several seconds, and shortening this period contributes to the convenience of the user.

The characteristics A or B in FIG. 7 can be approximated linearly, and the gradients thereof are substantially uniform. Therefore, if the permitted wavelength range which is permitted by the user is known, then the temperature at which the suppression of light output may be released can be determined with respect to the target temperature of the second temperature control device 53 through calculation. The temperature at which the suppression of light output may be released can be expressed as a temperature difference with respect to the target temperature, and therefore if this temperature difference is stored in the memory 60, the time period at the end of which the light may be started output can be shortened at any target temperature.

Figure 8:
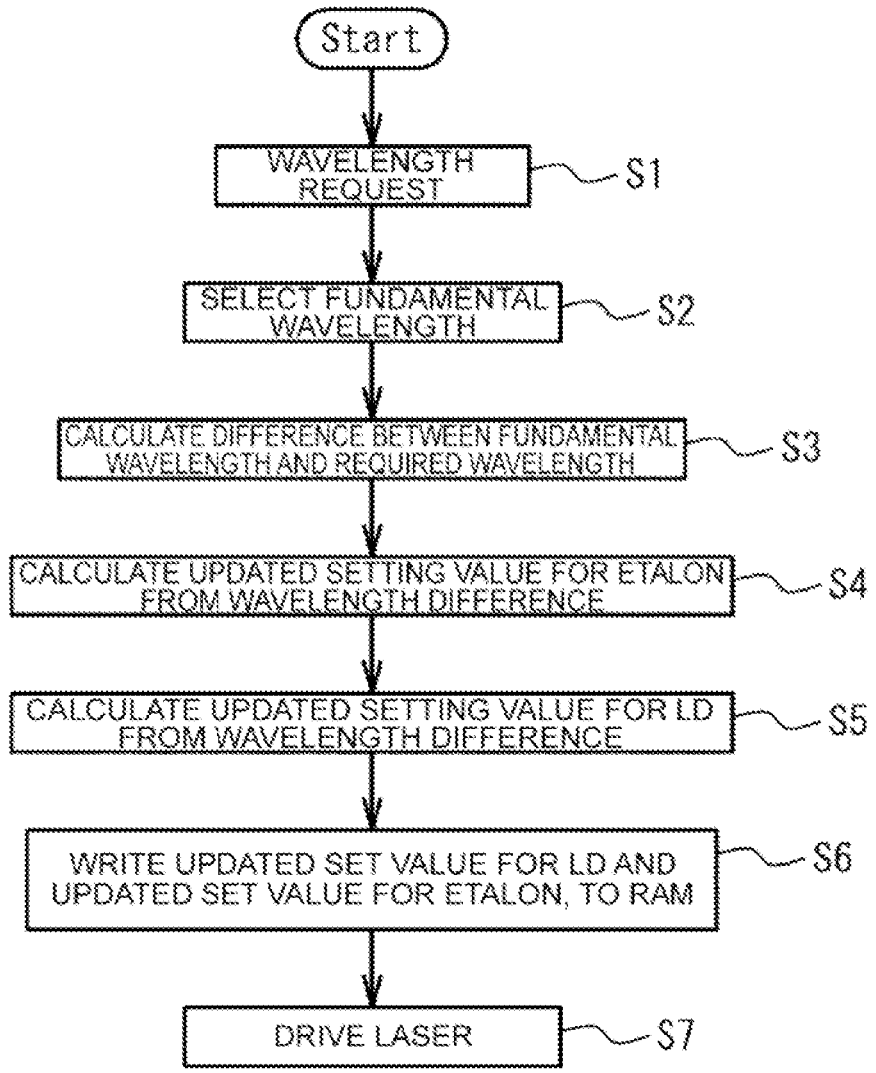
FIG. 8 is a flowchart showing primary steps from the step of inputting a required wavelength, which is carried out by the user, to the step of restarting the driving of a semiconductor laser.

Next, the control flow for the tunable wavelength laser according to the present embodiment will be described. FIG. 8 is a flowchart showing steps from the step, where the user inputs a required wavelength, to the step where driving of the semiconductor laser 30 starts. As shown in FIG. 8, the controller 70 receives the input of a required wavelength (in step S1). The following cases may occur: one case where the required wavelength is input as an actual value represented in wavelength or frequency; and another case where the required wavelength is input as indirect information including least two kinds of parameters, and for instance, in a certain case, a reference frequency (start grid wavelength), channel number and grid interval are input. For example, by use of the reference frequency "first channel frequency (FCF)", grid interval "Grid" and channel number "CH," a required wavelength is calculated. More specifically, the frequency F can be determined, in accordance with the Formula (2) below and a required wavelength can be calculated from the frequency F. When indirect information is input as the information, the controller 70 calculates the required wavelength using Formula (2) below, for instance:

$$F=FCF+(CH-1)\times Grid \quad (2).$$

Next, the controller 70 selects the fundamental wavelength depending on the required wavelength (in step S2). Then, the controller 70 calculates the difference between the fundamental wavelength and the required wavelength, which corresponds to the wavelength difference ΔF (in step S3). Next, the controller 70 reads out the initial setting value and feedback control target value relating to the fundamental wavelength, which have been selected in step S2, from the memory 60, and using the wavelength difference ΔF, the controller 70 calculates the set temperature Tetln_A of the etalon 72, which corresponds to an updated setting value (in step S4). Then, the controller 70 calculates the updated setting value of the semiconductor laser 30, using the wavelength difference ΔF (in step S5). The updated setting value for the semiconductor laser 30 correspond to the setting value, which is calculated from the initial set value in FIG. 3 and the wavelength difference ΔF for the semiconductor laser 30. Next, the controller 70 writes the update setting value of the etalon 72 and the update setting value of the semiconductor laser 30 to the RAM included in the controller 70 (in step S6). Next, the controller 70 drives the semiconductor laser 30 using, as the drive conditions, the updated setting values written to the RAM (in step S7).

Figure 9:
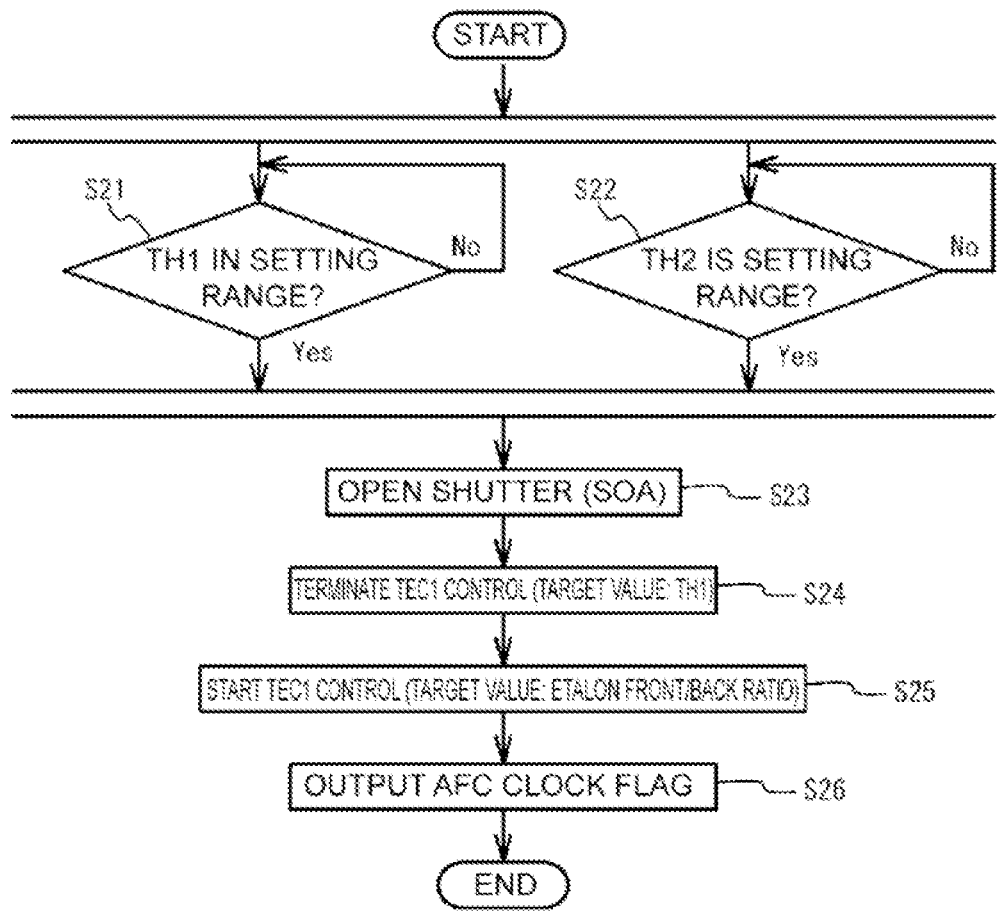
FIG. 9 is a flowchart which illustrates a driving operation of the semiconductor laser which follows the flowchart shown in FIG. 8.

FIG. 9 is a flowchart, which follows after the flowchart in FIG. 8, illustrating a driving operation of the semiconductor laser 30. As shown in FIG. 9, the controller 70 determines whether or not the detection temperature TH1 of the first thermistor 32 is in the range of $T_{LD}$ (in step S21). Here, the range of $T_{LD}$ has a prescribed range at the center of which the temperature value $T_{LD}$ of the drive conditions is located. When the determination in step S21 indicates "No", then the controller 70 changes the current value in such, a manner that the detection temperature TH1 of the first thermistor 32 approaches the temperature value $T_{LD}$, and supplies it to the first temperature control device 31.

In parallel with step S21, the controller 70 determines whether or not the detection temperature TH2 of the second thermistor 55 is in the setting range (in step S22). The setting range in this case is decided on the basis of the setting temperature, which is included in the drive conditions, of the etalon 72. For example, the setting range can be determined as a prescribed range at the center of which the setting temperature of the etalon 72 is located. When the determination in step S22 indicates "No", then the controller 70 changes the current value in such a manner that the detection temperature TH2 of the second thermistor 55 approaches the setting temperature of the etalon 72, and supplies it to the second temperature control device 53.

The controller 70 waits until the determination made in step S21 and step S22 indicates "Yes". When "Yes" determination is made in both step S21 and step S22, then the controller 70 carries out a shutter open operation (in step S23). More specifically, the controller 70 controls the current, which is to be supplied to the electrode 21 of the SOA region C, to the initial current value $I_{SOA}$. Consequently, a laser beam of wavelength based on the drive conditions is emitted by the semiconductor laser 30.

Next, the controller 70 terminates temperature control, which is carried out by the first temperature control device 31, for setting the temperature value $T_{LD}$ to the control target (in step S24). Then, the controller 70 starts the AFC control, which is carried out by the first temperature control device 31 (in step S25). In other words, the temperature of the first temperature control device 31 is controlled in a feedback control manner so as to satisfy the ratio $I_{m2}/I_{m1}$ of the feedback control target value. The ratio between the input light and the output light of the etalon 52 (the front/back ratio) indicates the lasing wavelength of the semiconductor laser 30. Furthermore, the first temperature control device 31 is used as a parameter which controls the wavelength of the semiconductor laser 30. In other words, in step S25, the wavelength of the semiconductor laser 30 is controlled through feedback control of the temperature of the first temperature control device 31, in such a manner that the front/back ratio becomes $I_{m2}/I_{m1}$, resulting in that the required wavelength is achieved. Upon confirming that the ratio $I_{m2}/I_{m1}$ is within the prescribed range at the center of which the target value $I_{m2}/I_{m1}$ for the fundamental wavelength selected in step S2 is, the controller 70 outputs an AFC lock flag (in step S26). Then, the execution of the flowchart is terminated.

Figure 10:
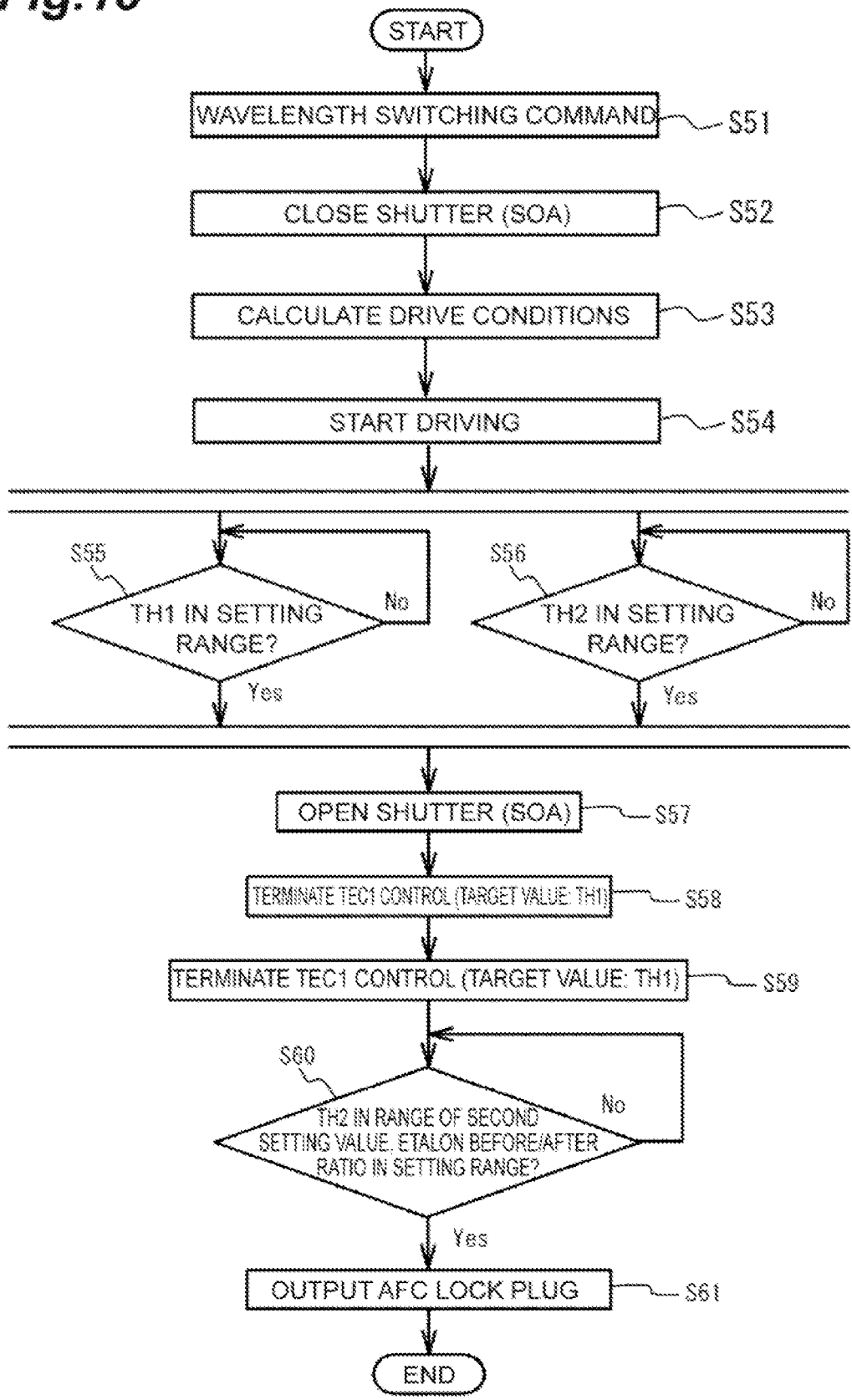
FIG. 10 is a flowchart illustrating the operation of switching a wavelength in one example.

Next, the operation of the switching of wavelength will be described. When an AFC lock flag has been output in the operation shown in FIG. 9 to carry out wavelength output at the required wavelength, a wavelength switching command by the user may be issued, and then the controller 70 executes a wavelength switching operation as shown in FIG. 10 in response to the wavelength switching command. FIG. 10 is a flowchart illustrating one example of a wavelength switching operation in the present embodiment.

As shown in FIG. 10, in response to the user's instruction on the switching of the wavelength (in step S51), the operation to close the shutter (SOA) is carried out (in step S52) in order to suppress light output. A typical way to suppress the output of light is to use the SOA as a light absorber. Furthermore, a way in which a mechanical shutter using a micro-machine or a shutter using liquid crystals is may be also applied thereto. Then, the drive conditions corresponding to the target wavelength to be switched which the user inputs is calculated (in step S53). The same tasks as in Steps S1 to S6 illustrated in FIG. 8 are carried out for this calculation.

Next, the controller 70 drives the tunable wavelength laser device 100 in accordance with the drive conditions written to the RAM (in step S54). After starting the driving, the voltage and/or current conditions corresponding to the respective sections of the tunable wavelength laser device 100 rapidly reach the designated conditions. On the other hand, carrying out feedback control for the temperatures of the first temperature control device 31 and the second temperature control device 53 is needed until these temperatures thereof reach the specified values (in step S55 and S56).

In the present embodiment, the temperature detection value TH2 of the second temperature control device 53 is managed by being divided into two levels. Firstly, in step S56, it is detected that the temperature has reached a range of Tb1 to Tb2 which corresponds to the permitted range Wa illustrated in FIG. 7, where the range of the temperatures Tb1 to Tb2 is set as the first setting value. The first temperature control device 31 controls the temperature of the semiconductor laser 30, and this temperature determines the fundamental temperature of the semiconductor laser 30 and accordingly does not involve a large change. On the other hand, the temperature of the second temperature control device 53 is used to change the wavelength characteristics of the etalon, and therefore a long time period is required for achieving convergence of this temperature. Therefore, the convergence in step S56 may be typically achieved after step S55.

When convergences in steps S55 and S56 are detected, the controller 70 cancels the suppression of optical output by opening the shutter (in step S57). Consequently, a laser beam at a wavelength in the range Wa of permitted wavelengths in FIG. 7 is output outwards. During this procedure, the second temperature control device continues temperature control from the range of the first setting value towards the temperature Tb, which is used as the second setting value, as shown in FIG. 7.

When the suppression of light output is cancelled in step S57, the temperature control of the first temperature control device 31 is changed to the control in which the front/back ratio of the etalon reaches the prescribed range, in other words, switches to automatic frequency control (in steps S58 and S59), rather than control towards the target temperature TH1. Then, when it is detected that the temperature of the second temperature control device 53 has reached a prescribed range corresponding to the second setting value, Tb, and that the front/back ratio of the etalon has reached the prescribed range (in step S60), then the AFC lock flag is output (in step S61) and the switching operation is terminated. In step S60, the prescribed range corresponding to the second setting value, Tb, has a width in which Tb is and which is narrower than the range of Tb1 to Tb2.

According to the present embodiment as described above, light output is carried out before the temperature of the second temperature control device 53 reaches Tb, which is the final target. Therefore, the start of wavelength control using the front/back ratio of the etalon can be made earlier, and the time period to be taken for the wavelength switching operation can therefore be shortened.

In step S56 in the flowchart in FIG. 10, it is detected that the temperature of the second temperature control device 53 has reached the temperature range of Tb1 to Tb2, but the invention is not limited to this. When the temperature of the second temperature control device 53 is controlled from temperature Ta to Tb, the shutter may be opened in response to the detection that the temperature has reached a temperature Tb1, which is on the near side of the temperature Tb with respect to temperature Ta (a temperature short of temperature Tb), in the temperature range of Tb1 to Tb2 corresponding to the allowable wavelength range Wa. It is possible to avoid phenomenon, such as overshooting, confirming that the temperature of the second temperature control device 53 has converged to the temperature range Tb1 to Tb2, for a specified period of time.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A method for switching an output wavelength of a tunable wavelength laser, the tunable wavelength laser being provided with a first temperature control device and a wavelength detecting section including an etalon being provided with a second temperature control device, the first temperature control device controlling a temperature of the tunable wavelength laser, the second temperature control device controlling a temperature of the etalon, the wavelength detecting section identifying the output of the tunable wavelength laser by a ratio of intensity of light input to the etalon against intensity of light output from the etalon, and the output wavelength of the tunable wavelength laser being controlled to a target wavelength based on a detection result of the wavelength detecting section, the method comprising:
a first step of driving the tunable wavelength laser at a first wavelength;
a second step of, after the first step, suppressing intensity of light output from the tunable wavelength laser in response to a command indicating preset intensity of light output from the tunable wavelength laser at a second wavelength different from the first wavelength;
a third step of, after the second step, starting control of the first temperature control device such that the temperature of the tunable wavelength laser becomes close to a second target temperature value of the tunable wavelength laser corresponding to the second wavelength, and starting control of the second temperature control device such that the temperature of the etalon becomes close to the second target temperature of the etalon corresponding to the second wavelength, the second target temperature value of the etalon being different from a first target temperature of the etalon corresponding to the first wavelength;

a fourth step of, before a second temperature value of the etalon reaches the second target temperature of the etalon, detecting whether the temperature of the etalon enters within a temperature range of the etalon corresponding to an allowable wavelength range around the second wavelength of the tunable wavelength laser, and, before the second temperature value of the etalon reaches the second target temperature of the etalon, cancelling the suppression of the intensity of the light output from the tunable wavelength laser in response to the detection, and a fifth step of detecting whether the temperature of the tunable wavelength laser reaches the second target temperature value of the tunable wavelength laser, and identifying the output of the tunable wavelength laser by a ratio of intensity of light input to the etalon against intensity of light output from the etalon, and the output wavelength of the tunable wavelength laser being controlled to a target wavelength based on a detection result of the wavelength detecting section.

2. The method according to claim 1, wherein the fifth step comprises a step of detecting whether the temperature of the etalon enters within another range around the second target temperature, the another range being narrower than the temperature range, and the detection is regarded as that the temperature of the etalon has reached the second target temperature when the temperature of the etalon enters within the another range.

3. The method according to claim 1, wherein the fourth step comprises a step of, before cancelling the suppression of the intensity of the light output from the tunable wavelength laser, confirming that the temperature of the etalon stays within the temperature range for a prescribed period.

4. A tunable wavelength laser device, comprising:
a tunable wavelength laser;
a wavelength detecting section configured to identify an output wavelength of the tunable wavelength laser by a ratio of intensity of light input to an etalon and intensity of light output from the etalon;
a first temperature control device for controlling a temperature of the tunable wavelength laser;
a second temperature control device configured to control a temperature of the etalon; and
a controller configured to set the output wavelength of the tunable wavelength laser to a target wavelength, the controller being configured to:
drive the tunable wavelength laser at a first wavelength;
suppress intensity of light output from the tunable wavelength laser in response to a command indicating that the tunable wavelength laser emits light at a second wavelength different from the first wavelength;
starting control of the first temperature control device such that the temperature of the tunable wavelength laser becomes close to a second target temperature value of the tunable wavelength laser corresponding to the second wavelength;
start control of the second temperature control device such that the temperature of the etalon becomes close to a second target temperature value of the etalon corresponding to the second wavelength, the second target temperature being different from a first target temperature of the etalon corresponding to the first wavelength;
acquire a detection result indicating that the temperature of the etalon has entered a temperature range corresponding to an allowable wavelength range around the second wavelength of the tunable wavelength laser, before the temperature of the etalon reaches the second target temperature; and
cancel the suppression of the intensity of the light output from the tunable wavelength laser before the temperature of the etalon reaches the second target temperature,
wherein the controller acquires the detection result indicating that the temperature of the etalon has reached a second target temperature.

5. The tunable wavelength laser device according to claim 4, wherein the controller acquires the detection result indicating that the temperature of the etalon enters another range around the second target temperature value, the another range being narrower than the temperature range, and wherein the temperature of the etalon is regarded to reach the second target temperature value when the temperature of the etalon enters the range.

6. The tunable wavelength laser device according to claim 4, wherein the controller cancels the suppression of the intensity of the light output from the tunable wavelength laser after the temperature of the etalon is confirmed to stay within the temperature range for a prescribed period.

7. The tunable wavelength laser device according to claim 4, further comprising a temperature detecting section provided on the second temperature control device, the temperature detecting section detecting the temperature of the etalon.

8. The tunable wavelength laser device according to claim 4, wherein the tunable wavelength laser includes an optical semiconductor amplifier preventing the tunable wavelength laser from emitting light.

9. A method for switching an output wavelength of a tunable wavelength laser, the tunable wavelength laser being provided with a first temperature control device and a wavelength detecting section including an etalon being provided with a second temperature control device, the first temperature control device controlling a temperature of the tunable wavelength laser, the second temperature control device controlling a temperature of an etalon, the wavelength detecting section identifying the output of the tunable wavelength laser by a ratio of intensity of light input to the etalon against intensity of light output from the etalon, and the output wavelength of the tunable wavelength laser being controlled to a target wavelength based on a detection result of the wavelength detecting section,
the method comprising:
a first step of driving the tunable wavelength laser at a first wavelength;
a second step of, after the first step, suppressing intensity of light output from the tunable wavelength laser in response to a command indicating preset intensity of light output from the tunable wavelength laser at a second wavelength different from the first wavelength;
a third step of, after the second step, starting control of the first temperature control device such that the temperature of the tunable wavelength laser becomes close to a second target temperature value of the tunable wavelength laser corresponding to the second wavelength, and starting control of the second temperature control device such that the temperature of the etalon becomes close to a second target temperature corresponding to the second wavelength, the second target temperature being different from a first target temperature corresponding to the first wavelength;
a fourth step of, before the temperature of the etalon reaches the second target temperature, detecting whether the temperature of the etalon enters within a temperature range corresponding to an allowable wavelength range around the second wavelength of the tunable wavelength laser, and, before the temperature of the etalon reaches the second target temperature, cancelling the suppression of the intensity of the light output from the tunable wavelength laser in response to the detection; and
a fifth step of detecting whether the temperature of the tunable wavelength laser reaches the second target temperature value of the tunable wavelength laser, and identifying the output of the tunable wavelength laser by a ratio of intensity of light input to the etalon against intensity of light output from the etalon, and the output wavelength of the tunable wavelength laser being controlled to a target wavelength based on a detection result of the wavelength detecting section.

* * * * *